United States Patent
Dalton et al.

(10) Patent No.: US 6,831,363 B2
(45) Date of Patent: Dec. 14, 2004

(54) STRUCTURE AND METHOD FOR REDUCING THERMO-MECHANICAL STRESS IN STACKED VIAS

(75) Inventors: Timothy J. Dalton, Ridgefield, CT (US); Sanjit K. Das, Poughkeepsie, NY (US); Brett H. Engel, Hopewell Junction, NY (US); Brian W. Herbst, Poughquag, NY (US); Habib Hichri, Wappingers Falls, NY (US); Bernd E. Kastenmeier, Austin, TX (US); Kelly Malone, Poughkeepsie, NY (US); Jeffrey R. Marino, Fishkill, NY (US); Arthur Martin, Queens Village, NY (US); Vincent J. McGahay, Poughkeepsie, NY (US); Ian D. Melville, Highland, NY (US); Chandrasekhar Narayan, Hopewell Junction, NY (US); Kevin S. Petrarca, Newburgh, NY (US); Richard P. Volant, New Fairfield, CT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/319,032

(22) Filed: Dec. 12, 2002

(65) Prior Publication Data

US 2004/0113278 A1 Jun. 17, 2004

(51) Int. Cl.[7] .................. H01L 23/48; H01L 23/52; H01L 29/40
(52) U.S. Cl. .................. 257/751; 438/629; 438/639
(58) Field of Search ................. 257/750, 758, 257/622; 438/629, 639, 622, 624

(56) References Cited

U.S. PATENT DOCUMENTS

| | | | |
|---|---|---|---|
| 6,586,334 B2 | * | 7/2003 | Jiang |
| 6,599,827 B1 | * | 7/2003 | Ngo et al. |
| 6,605,549 B2 | * | 8/2003 | Leu et al. |
| 6,613,664 B2 | * | 9/2003 | Barth et al. |
| 6,620,727 B2 | * | 9/2003 | Brennan |

* cited by examiner

*Primary Examiner*—S. V. Clark
(74) *Attorney, Agent, or Firm*—Lisa U. Jaklitsch; Cantor Colburn LLP

(57) ABSTRACT

An interconnect structure for a semiconductor device includes an organic, low dielectric constant (low-k) dielectric layer formed over a lower metallization level. A via formed is within the low-k dielectric layer, the via connecting a lower metallization line formed in the lower metallization level with an upper metallization line formed in an upper metallization level. The via is surrounded by a structural collar selected from a material having a coefficient of thermal expansion (CTE) so as to protect the via from shearing forces following a thermal expansion of the low-k dielectric layer.

15 Claims, 7 Drawing Sheets

STRUCTURE AND METHOD FOR REDUCING THERMO-MECHANICAL STRESS IN STACKED VIAS

BACKGROUND

The present invention relates generally to semiconductor device manufacturing and, more particularly, to a structure and method for reducing thermo-mechanical stress in stacked vias.

In the fabrication of integrated circuit devices, it is often desirable to isolate individual components of the integrated circuits from one another with insulative materials. Such insulative materials may include, for example, silicon dioxide, silicon nitride and silicon carbide. While these materials may have acceptable insulating properties in many applications, they also have relatively high dielectric constants, which can lead to capacitive coupling between proximate conductive elements. This is particularly disadvantageous, given the ever-decreasing distances between conductive circuit elements, and the use of multi-layered structures. An unnecessary capacitive coupling between adjacent wires increases the RC time delay of a signal propagated therethrough, resulting in decreased device performance. Thus, for specific applications, insulating materials having relatively low dielectric constants (e.g., $\kappa<3$) are desired.

Certain organic polymers are known in the semiconductor manufacturing industry for their "low-k" dielectric properties, which polymers are often used for intermetallic insulation in damascene structures. These polymers are generally classified as aromatic thermosets, polyarylene ethers and crosslinked polyphenylene polymers. Examples of such polymers include SiLK® (manufactured by The Dow Chemical Company), FLARE® and GX3® (both manufactured by the Honeywell corporation). SiLK®, for instance, is typically applied to semiconductor wafers by spin-on coating in a wafer track, similar to the process used in the application of photolithography resist.

However, the integration of an all low-k dielectric like SiLK® in semiconductor manufacturing has presented several challenges such as, for example, the effects of thermal expansion differences between the low-k dielectric material and the interconnect materials (e.g., copper, oxide). In particular, the coefficient of thermal expansion (CTE) of SiLK® is about 133 ppm up to 400–440° C. (SiLK® is cured between 400–450° C. during integration), whereas the CTE of copper and oxide is about 17 ppm and 4 ppm, respectively. As a result of this relatively large CTE differential, there are often stacked via failures (e.g., sheared vias) after about 1000 thermal cycles. In order to address this structural problem, prior approaches have replaced an all-SiLK® dielectric with a hybrid build of SiLK® and oxide in which the oxide is used entirely within the via level. One tradeoff, however, in replacing SiLK® with oxide at the via level is the higher RC delay due to the higher dielectric constant of the oxide. In addition, there is also a higher cost associated with single damascene hybrid build.

Accordingly, it is desirable to be able to take advantage of the low-k properties of dielectric materials such as SiLK®, while still maintaining structural integrity of the back end of line (BEOL) interconnects.

SUMMARY

The foregoing discussed drawbacks and deficiencies of the prior art are overcome or alleviated by an interconnect structure for a semiconductor device including an organic, low dielectric constant (low-k) dielectric layer formed over a lower metallization level. A via formed is within the low-k dielectric layer, the via connecting a lower metallization line formed in the lower metallization level with an upper metallization line formed in an upper metallization level. The via is surrounded by a structural collar selected from a material having a coefficient of thermal expansion (CTE) so as to protect the via from shearing forces following a thermal expansion of the low-k dielectric layer.

In another aspect, a method for reducing thermo-mechanical stress in a semiconductor device interconnect structure includes forming an organic, low dielectric constant (low-k) dielectric layer formed over a lower metallization level. An opening is defined in the low-k dielectric layer and over a lower metallization line formed in said lower metallization level. The opening formed in the low-k dielectric layer is filled with a structural material having a coefficient of thermal expansion (CTE) sufficient to protect a via from shearing forces following a thermal expansion of the low-k dielectric layer. Then, a via opening is defined in the structural material and the via opening is thereafter filled with a conductive via material, wherein remaining portions of the structural material form a protective collar surrounding the via material.

In yet another aspect, a method for forming an interconnect structure for a semiconductor device includes forming an organic, low dielectric constant (low-k) dielectric layer over a lower metallization level, the low-k dielectric layer being formed at a sufficient thickness to define a via level over the lower metallization level and an upper metallization level over the via level. An opening is defined in the low-k dielectric layer and over a lower metallization line formed in the lower metallization level, the opening then being filled with a structural material having a coefficient of thermal expansion (CTE) sufficient to protect a via subsequently formed therein from shearing forces following a thermal expansion of the low-k dielectric layer. A via opening in then defined in the structural material, and an upper metallization line opening is defined over the via opening. The via opening and the upper metallization line opening are filled with a conductive material, thereby defining a via connecting the lower metallization to an upper metallization line, wherein remaining portions of the structural material form a protective collar surrounding the via.

BRIEF DESCRIPTION OF THE DRAWINGS

Referring to the exemplary drawings wherein like elements are numbered alike in the several Figures.

DETAILED DESCRIPTION

Disclosed herein a structure and method for reducing thermo-mechanical stress in stacked vias (without fully replacing a low-k dielectric with oxide at the via level) while, at the same time, providing a cost effective integration solution. Briefly stated, the via level between an upper and lower metallization level in a semiconductor device is formed primarily with an organic, low-k material such as SiLK®. However, the actual via metallization is surrounded by a thin structural collar (such as an oxide) that more closely matches the CTE of the metal fill, thereby protecting the via from any thermal expansion of the organic low-k material. The collar may be formed by either a single damascene or a dual damascene process, as is described in further detail hereinafter. Although the metallization is more vulnerable to thermal expansion at the via level, the structural collar may also be used as a side liner material at the line levels for an additional measure of support.

Figure 1A:
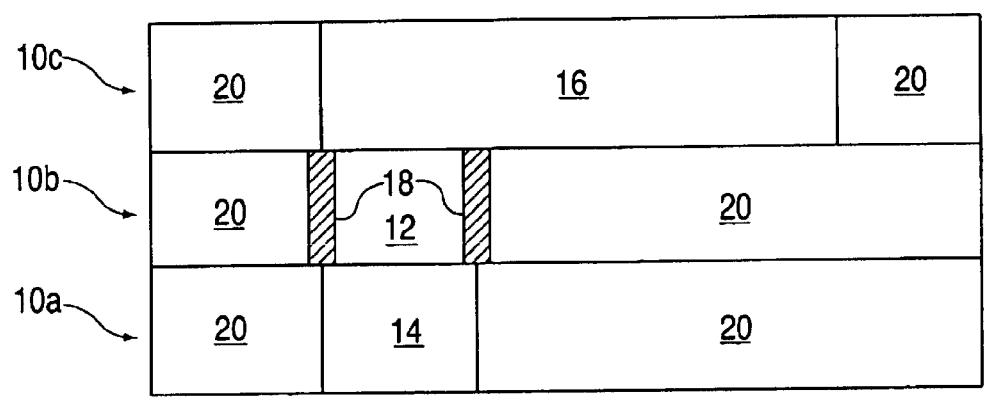
FIG. 1(a) is a sectional view of a plurality of semiconductor device levels in which a via connecting a lower metallization line with an upper metallization line is structurally reinforced with a surrounding rigid collar, in accordance with an embodiment of the invention.
Figure 1B:
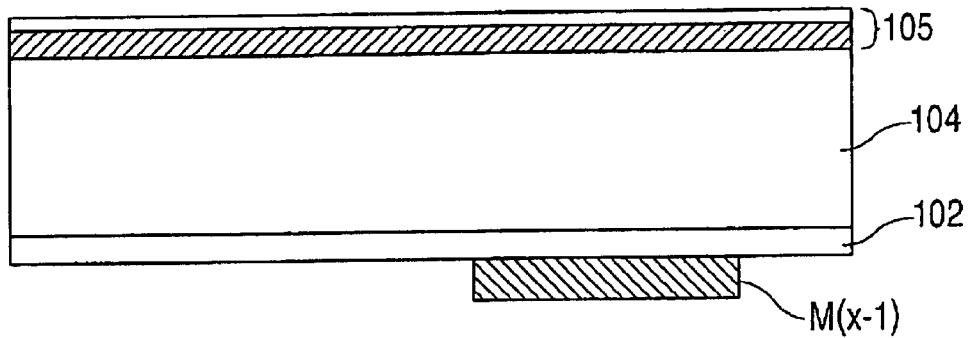
FIGS. 1(b) through 1(f) are sectional views illustrating various processing steps of an exemplary single damascene integration scheme that may be implemented in forming the via collar similar to that shown in FIG. 1(a)

FIG. 1(a) is a sectional view of an exemplary embodiment of a plurality of semiconductor device levels 10a, 10b, 10c, in which a structurally reinforced via 12 connects a lower metallization line 14 with an upper metallization line 16. The via 12 is surrounded by a thin structural collar 18 which may be formed from a rigid material such as $SiO_2$, SiCOH, carbides, nitrides, and metal oxides, or other suitable material having a comparable CTE to that of the metal fill material. Elsewhere, the interlevel dielectric material is an organic, low-k material 20 such as SiLK®, preferably applied in a spin on fashion. In this manner, the benefits of the low-k dielectric are obtained while, at the same time, the deleterious effects of the high CTE of the SiLK® upon via 12 are addressed in terms of the lateral shearing forces generated thereon.

If single damascene processing is implemented, the formation of the protective structural collar is easily integrated into the fabrication process. For example, upon completion of the lower metallization level 10a (e.g., M1) by filling, polishing and capping, etc., the next level (via level 10b) is coated with a single damascene thickness of the SiLK® or other organic spin on low-k dielectric. After the application of an appropriate hardmask layer(s), the via level 10b is patterned for via definition (e.g., V1). However, in order to accommodate the formation of the collar 18, the patterned opening in via level 10b is made larger than the normal opening for a conventionally formed via 12. Once the opening in level 10b is formed, it is filled with the structurally protective material, such as an oxide, by existing CVD/PVD or spin-on techniques.

After planarization of the oxide fill material, a subsequent patterning and etch step is used to define the via opening. This results in a thin sidewall layer (e.g., about 100 Å to about 450 Å) of oxide material surrounding the via opening, since the via opening will be patterned to have a slightly smaller diameter than the opening made for the oxide fill material. Then, the V1 metallization is added in accordance with known damascene processing techniques, and is thereafter planarized to complete via level 10b. The upper metallization level 10c is then formed, beginning with another application of the low-k dielectric, and the upper metallization line 16 (e.g., M2) is defined and filled in so as to connect to via 12. As will be appreciated, the thickness of collar 18 is sufficient to maintain the structural integrity of the via 12, but not so thick so as to have a significant impact on capacitive coupling in the event that the collar material is not a low-k material, such as in the case of an oxide material.

Referring generally to FIGS. 1(b) through 1(f), there is shown another exemplary single damascene integration scheme 100 that may be implemented in forming the via collar similar to that shown in FIG. 1(a). In the lower portion of FIG. 1(b), a previously formed lower metallization line is denoted generally by M(x−1) to indicate that the lower metallization line may be physically located at any of a number of metallization levels of a given semiconductor device. In addition, a cap layer 102 is formed over the lower metallization level in preparation for the next layer 104 of low-k dielectric material (SiLK®), which is coated for a single damascene build. The application of the SiLK® is subsequently followed by the formation of one or more layers of hardmask material 105 thereupon.

Figure 1C:
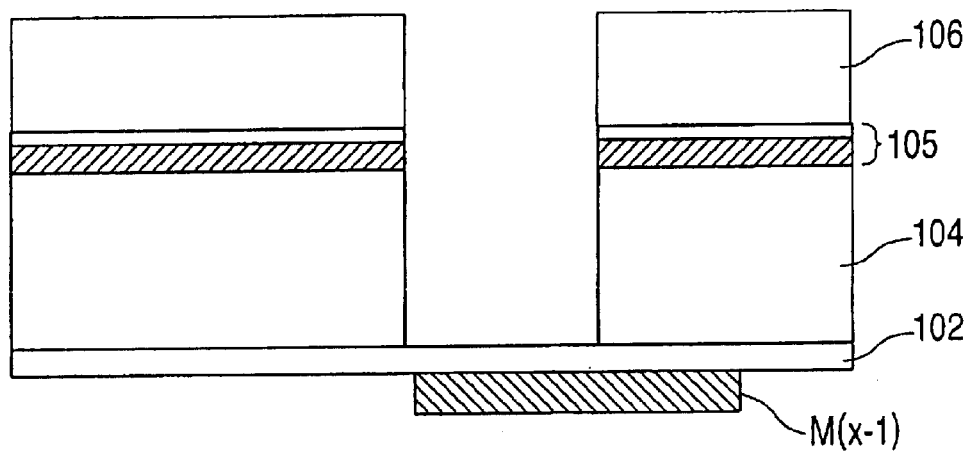
Figure 1D:
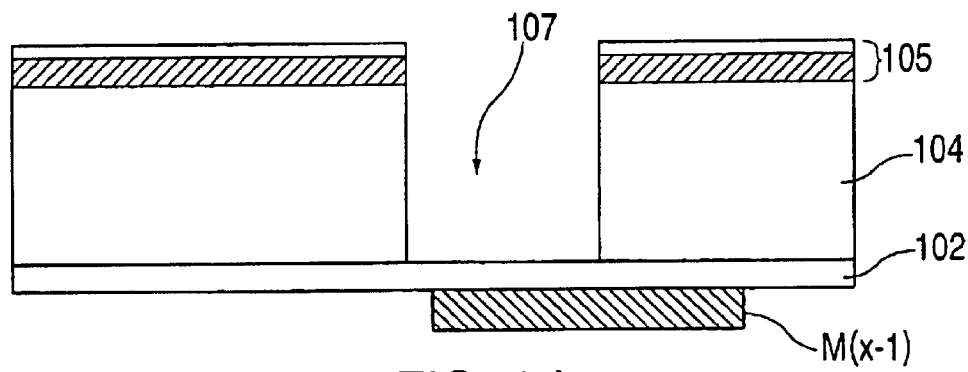
Figure 1E:
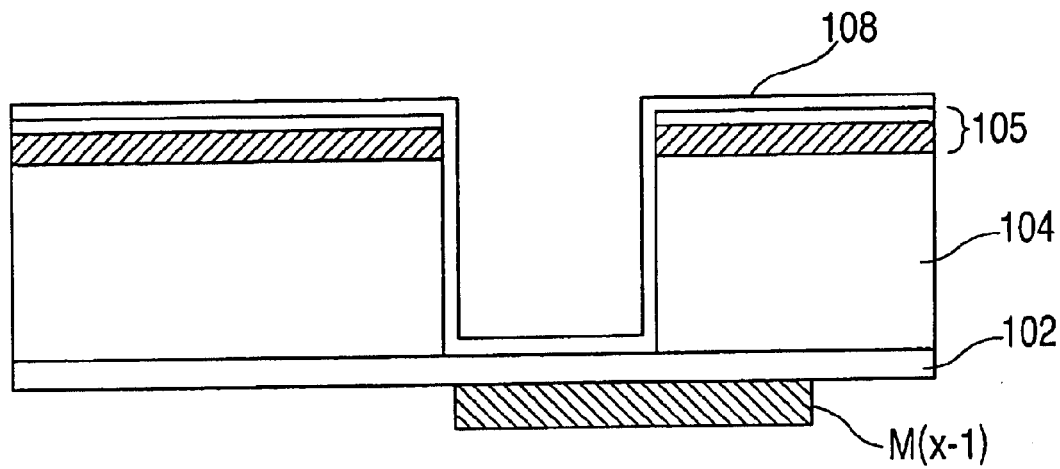
Figure 1F:
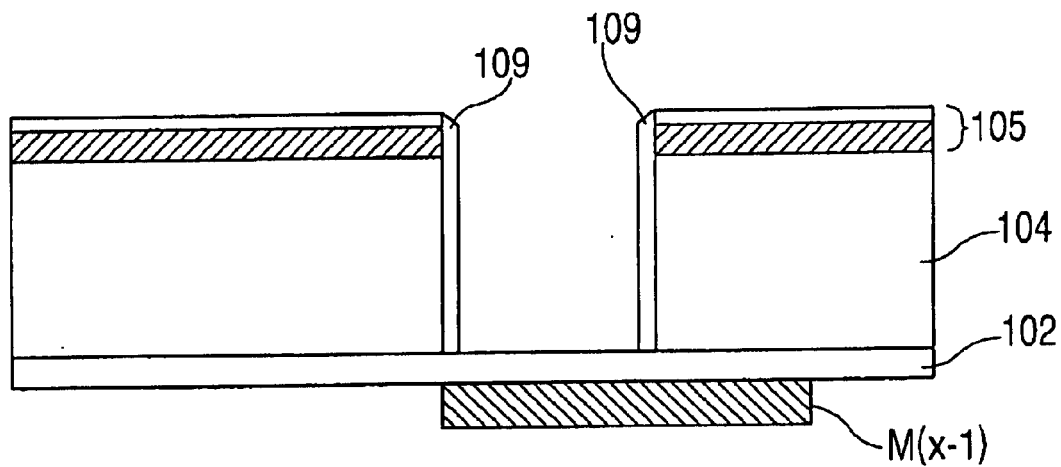

In FIG. 1(c), a layer of photoresist 106 is applied over the hardmask 105 and thereafter imaged and patterned for the formation of a via for connection to the lower metallization. Then, in FIG. 1(d), a via opening 107 is defined by etching through the hardmask 105, the SiLK® layer 104 and the cap layer 102, thereby exposing M(x−1). In this embodiment, the protective (e.g., oxide) material is conformally deposited over the hardmask 105, the walls of the via opening 107 and M(x−1) to form a layer 108, illustrated in FIG. 1(e). Once deposited, the layer 108 is directionally etched (i.e., anisotropically etched) so as to leave a collar structure 109 on the via walls, as shown in FIG. 1(f). Thus, it will be appreciated that this process embodiment eliminates the need for additional lithography and CMP steps associated with a complete oxide fill of the opening 107.

As stated previously, the formation of a protective via collar is also suited for dual damascene processing. In FIGS. 2(a) through 2(f), there is shown one embodiment of an exemplary dual damascene integration scheme 200 that may be implemented in lining a via level with a protective material to result in a protective collar-like structure similar to the embodiment depicted in FIG. 1(a). In the lower portion of FIG. 2(a), a previously formed lower metallization line is denoted generally by M(x−1) to indicate that the lower metallization line may be physically located at any of a number of metallization levels of a given semiconductor device. In addition, a cap layer 202 is formed over the lower metallization level in preparation for the next layer 204 of low-k dielectric material (SiLK®), which is coated for a dual damascene build. That is, the SiLK® is applied at a thickness sufficient for both the via and next metallization levels. The application of the SiLK® is subsequently followed by the formation of one or more layers of hardmask material 205 thereupon.

Figure 2A:
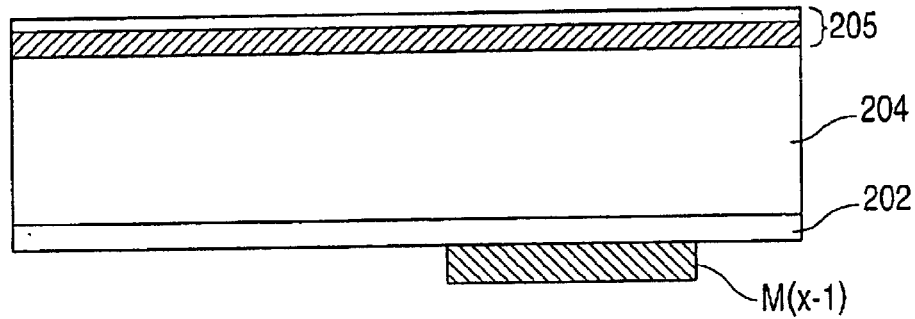
FIGS. 2(a) through 2(f) are sectional views illustrating various processing steps of an exemplary dual damascene integration scheme that may be implemented in lining a via level with a protective material to result in a protective collar-like structure, in accordance with a further embodiment of the invention.
Figure 2B:
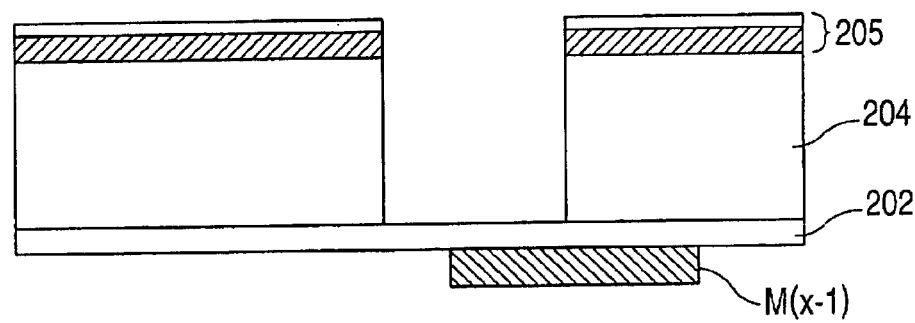
Figure 2C:
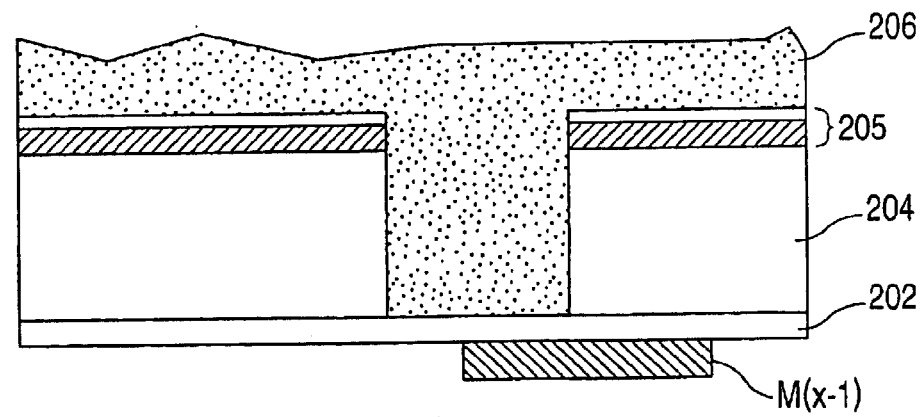

FIG. 2(b) illustrates the definition (by patterning and etching) of the upper metallization line(s), which will be denoted generally by Mx, all the way though SiLK® layer 204 and down to cap layer 202 over lower metallization line M(x−1). In this particular embodiment, the opening is patterned in accordance with the design width of the upper metallization line Mx. Then, as shown in FIG. 2(c), the material 206 used for the structural collar/liner is filled within the opening created in FIG. 2(b). Again, an exemplary structural material 206 may be an oxide deposited by CVD/PVD or spin-on techniques. The oxide material 206 is then planarized in preparation for the via (Vx) and upper metallization line Mx lithography and etching steps.

Figure 2D:
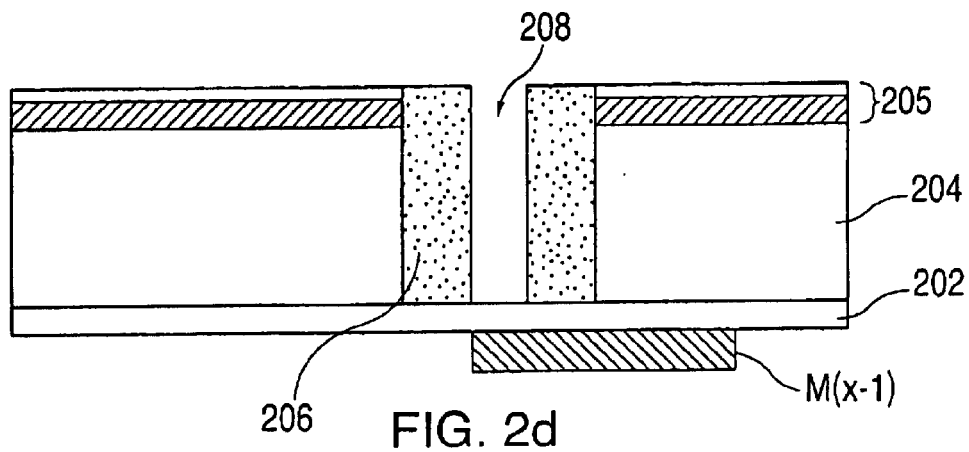

Referring now to FIG. 2(d), a first lithography/RIE is performed in order to define an opening 208 for via Vx.

Figure 2E:
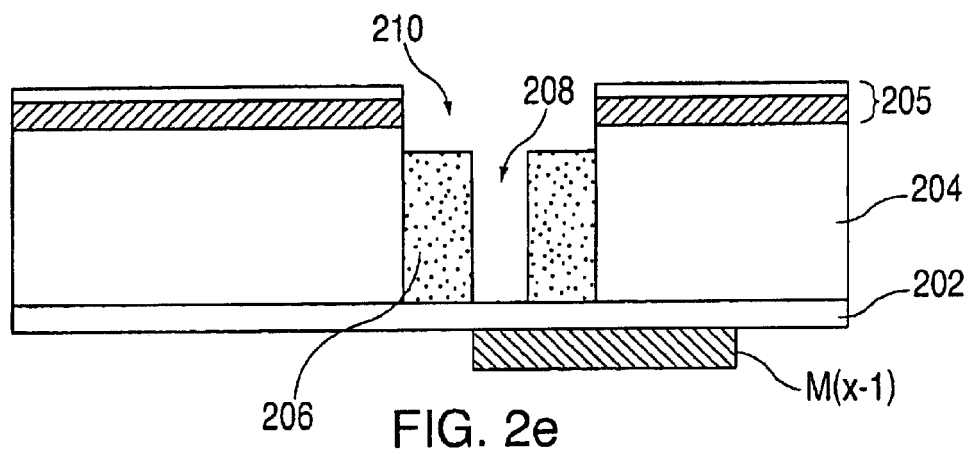
Figure 2F:
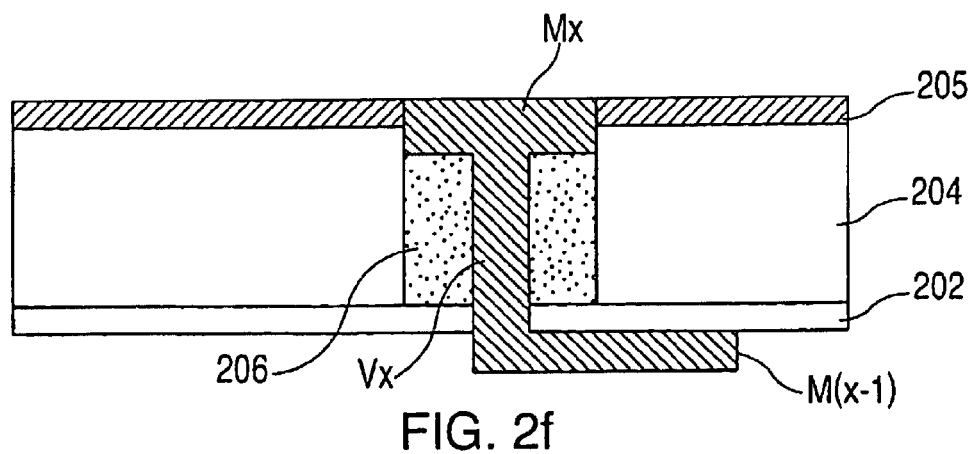

Subsequently, in FIG. 2(e), a second lithography/RIE step is used to define a trench like opening 210 in the oxide material 206 for the upper metallization line Mx, wherein it is noted that the same mask may be used for the second lithography/RIE step as was used in the etching step of FIG. 2(b). Finally, in FIG. 2(f), the liner and metallization materials are deposited within both openings 208 and 210 in accordance with dual damascene processing, with the excess metal being thereafter planarized down to a first of the hardmask layers. As can be seen, the remaining portions of the oxide material 206 adjacent the via Vx form sidelines in the via level, thereby protecting the via material from shearing forces of the expanding SiLK® layer 204 when the device is subjected to high temperature processes such as annealing.

Figure 3A:
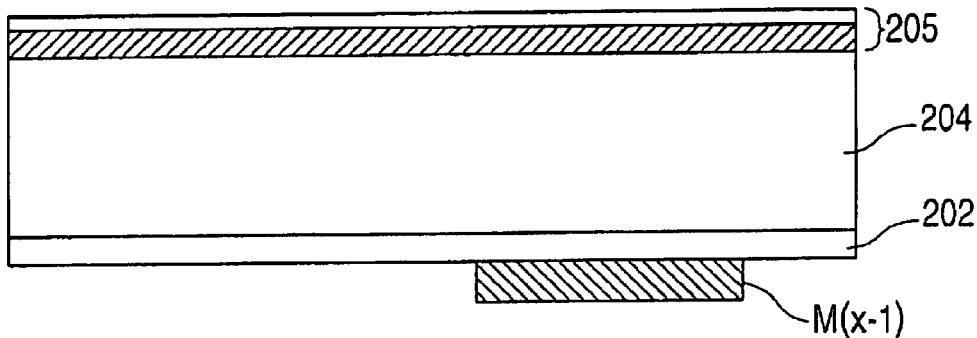
FIGS. 3(a) through 3(f) are sectional views illustrating various processing steps of an alternative dual damascene integration scheme that may be implemented in lining a via level and an upper metallization layer with a protective material to result in a protective collar-like structure.
Figure 3B:
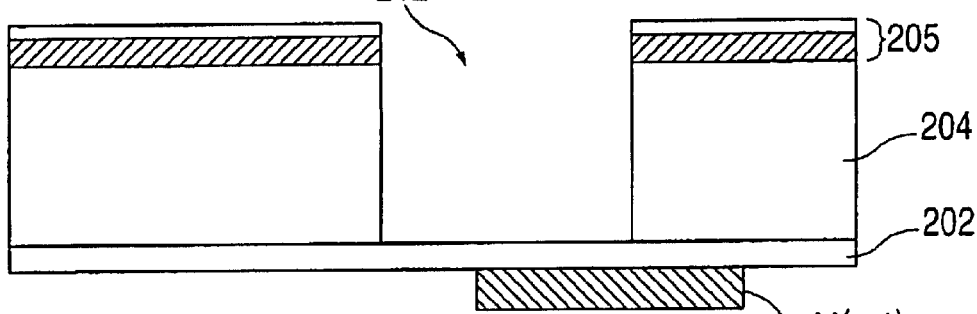
Figure 3C:
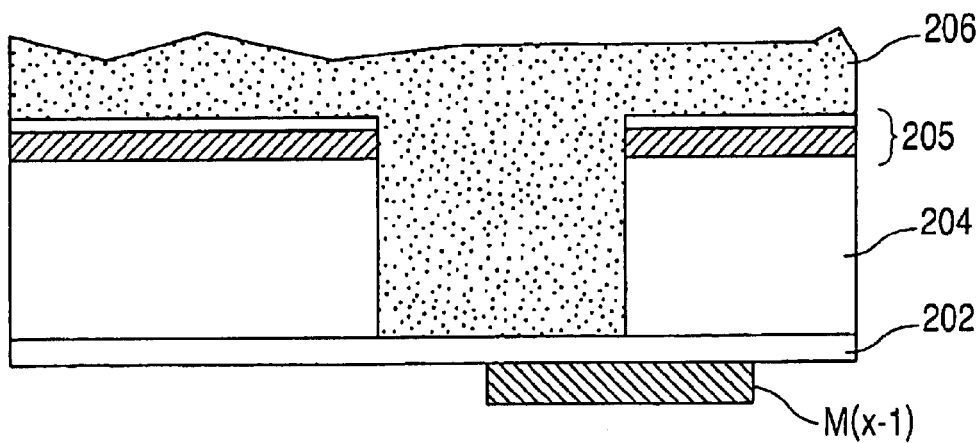
Figure 3D:
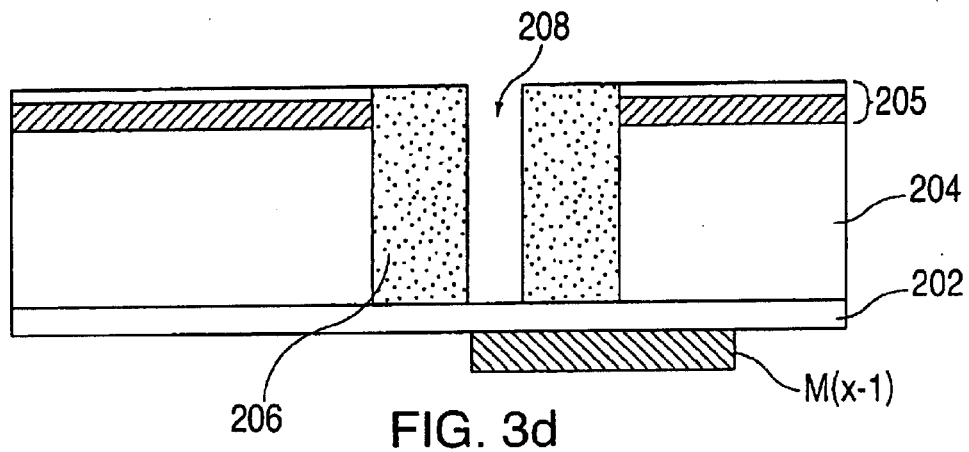

Still another dual damascene embodiment is illustrated in FIGS. 3(a) through 3(f) in which the oxide material 206 is used as a structural liner in both the via level and the upper metallization level. Thus, as shown in FIG. 3(b), the patterning and etching of the SiLK® layer 204 is overexposed to make a larger opening 212 through both the Mx and Vx levels (compared to the opening shown in FIG. 2(b), so as to allow for some oxide material to remain after the Mx line is eventually etched. As is the case for the previous embodiment, the oxide material 206 used for the structural collar/liner is filled within the opening created in FIG. 3(b), as shown in FIG. 3(c). Then, a lithography/RIE step is performed in order to define the opening 208 for via Vx, as shown in FIG. 3(d).

Figure 3E:
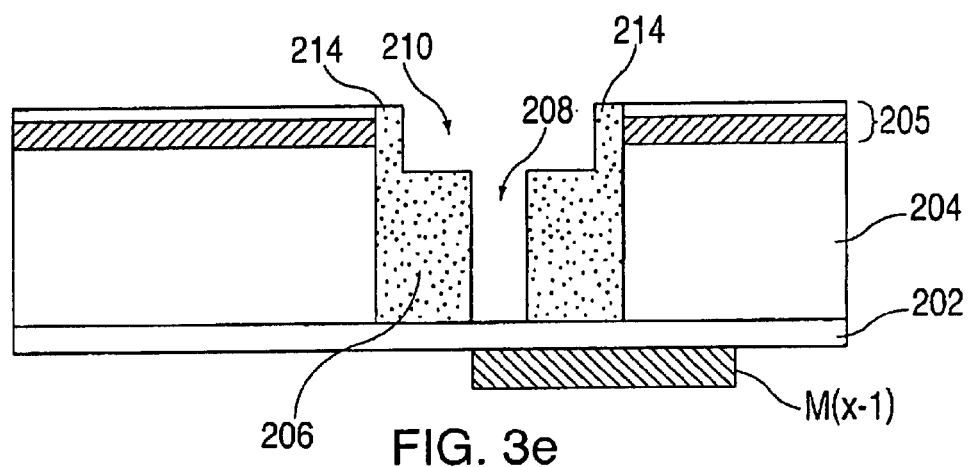
Figure 3F:
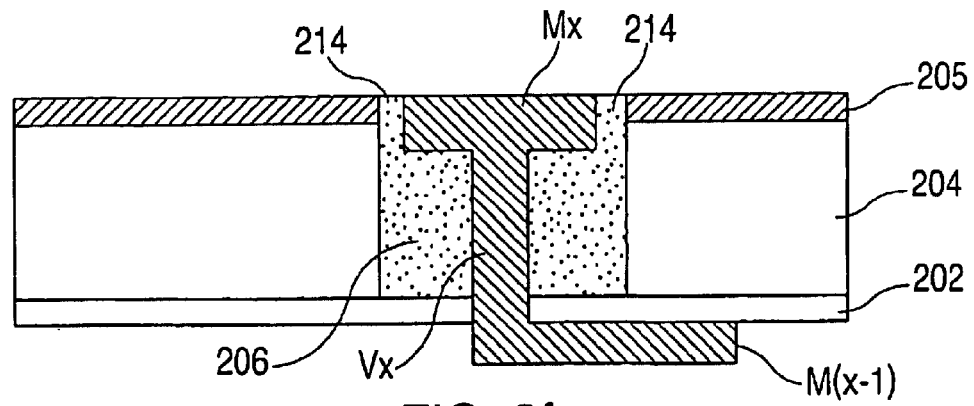

However, when the second lithography/RIE step is carried out to define the opening 210 for Mx, the pattern is not overexposed. Therefore, opening 210 is smaller than opening 212, thereby creating sidewalls 214 that partially surround the upper metallization level as shown in FIG. 3(e). Then, as shown in FIG. 3(f), the dual damascene metal fill is implemented to form Vx and Mx, with the excess metal being thereafter planarized down to the first hardmask layer.

Regardless of which dual damascene scheme is used, the above described process embodiments provide a protective layer (such as $SiO_2$, SiCOH, nitrides, carbides and metal oxides, etc.) at the via level or at both the via and line levels, and with only a slight increase in the number of process variations/steps. In the case of FIGS. 2(a)–(e), there is a single additional lithography/RIE step (without the need for a new mask), a single additional planarizing (CMP) step, and a single additional oxide step. This is also the case for the embodiment of FIGS. 3(a)–(e), with the exception that the first lithography/RIE step is carried out at an over exposure to create a wider opening for the thin oxide liner at the upper metallization level. Moreover, the particular thickness/dimensions of the oxide (or whatever material is selected) may be tailored to meet technology requirements. And, as is also the case with the embodiment of FIGS. 1(b)–1(f), the protective collar is in contact with the via copper and matches the CTE thereof more closely, thus resisting thermal cycle induced stacked via failures.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An interconnect structure for a semiconductor device, comprising:
    an organic, low dielectric constant (low-k) dielectric layer formed over a lower metallization level;
    a via formed within said low-k dielectric layer, said via connecting a lower metallization line formed in said lower metallization level with an upper metallization line formed in an upper metallization level; and
    a structural collar surrounding said via, said structural collar being selected from a material having a coefficient of thermal expansion (CTE) so as to protect said via from shearing forces following a thermal expansion of said low-k dielectric layer.

2. The interconnect structure of claim 1, wherein said structural collar material is selected from: an oxide, a nitride, a carbide and combinations comprising at least one of the foregoing.

3. The interconnect structure of claim 1, wherein said structural collar has a sidewall thickness of about 100 angstroms (Å) to about 450 Å.

4. The interconnect structure of claim 1, wherein said structural collar material is also used to form a liner partially surrounding said upper metallization line.

5. The interconnect structure of claim 1, wherein said structural collar is formed only on vertical surfaces around said via.

6. A method for reducing thermo-mechanical stress in a semiconductor device interconnect structure, the method comprising:
    forming an organic, low dielectric constant (low-k) dielectric layer over a lower metallization level;
    defining an opening in said low-k dielectric layer and over a lower metallization line formed in said lower metallization level;
    filling said opening formed in said low-k dielectric layer with a structural material having a coefficient of thermal expansion (CTE) sufficient to protect a via from shearing forces following a thermal expansion of said low-k dielectric layer;
    defining a via opening in said structural material; and
    filling a via opening with a conductive via material, wherein remaining portions of said structural material form a protective collar surrounding said via material.

7. The method of claim 6, wherein said structural material is selected from: an oxide, a nitride, a carbide and combinations comprising at least one of the foregoing.

8. The method of claim 6, wherein said protective collar surrounding said via material has a thickness of about 100 angstroms (Å) to about 450 Å.

9. The method of claim 6, wherein said filling said opening formed in said low-k dielectric layer with said structural material further comprises conformally depositing a layer of said structural material within said opening, and thereafter etching said conformally deposited layer of said structural material such that said structural material remains only upon vertical surfaces of said opening.

10. The method of claim 9, wherein said via opening is defined by said structural surfaces remaining on said vertical surfaces of said opening.

11. A method for forming an interconnect structure for a semiconductor device, the method comprising:
    forming an organic, low dielectric constant (low-k) dielectric layer over a lower metallization level, said low-k dielectric layer being formed at a sufficient thickness to define a via level over said lower metallization level and an upper metallization level over said via level;

defining an opening in said low-k dielectric layer and over a lower metallization line formed in said lower metallization level;

filling said opening formed in said low-k dielectric layer with a structural material having a coefficient of thermal expansion (CTE) sufficient to protect a via subsequently formed therein from shearing forces following a thermal expansion of said low-k dielectric layer;

defining a via opening in said structural material;

defining an upper metallization line opening over said via opening; and filling said via opening and said upper metallization line opening with a conductive material, thereby defining a via connecting said lower metallization to an upper metallization line, wherein remaining portions of said structural material form a protective collar surrounding said via.

12. The method of claim 11, wherein said structural material is selected from: an oxide, a nitride, a carbide and combinations comprising at least one of the foregoing.

13. The method of claim 11, wherein the width of said opening formed in said low-k dielectric layer is substantially the same as said upper metallization line opening such that, when said upper metallization line opening is defined, said structural material is removed from said upper metallization level.

14. The method of claim 11, wherein the width of said opening formed in said low-k dielectric layer is larger than said upper metallization line opening such that, when said upper metallization line opening is defined, remaining portions of said structural material in said upper metallization level form a liner partially surrounding said upper metallization line.

15. The method of claim 14, wherein a common photolithography mask is used in forming both said opening in said low-k dielectric layer and said upper metallization line opening, wherein said mask is overexposed during the formation of said opening in said low-k dielectric layer.

* * * * *